(12) United States Patent
Sandoh

(10) Patent No.: US 11,628,515 B2
(45) Date of Patent: Apr. 18, 2023

(54) PROCESSING APPARATUS FOR PROCESSING WORKPIECE

(71) Applicant: DISCO CORPORATION, Tokyo (JP)

(72) Inventor: Hideyuki Sandoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 194 days.

(21) Appl. No.: 17/017,274

(22) Filed: Sep. 10, 2020

(65) Prior Publication Data

US 2021/0078101 A1    Mar. 18, 2021

(30) Foreign Application Priority Data

Sep. 13, 2019  (JP) .............................. JP2019-167032

(51) Int. Cl.
*B23K 26/03*    (2006.01)
*B23K 26/40*    (2014.01)

(52) U.S. Cl.
CPC .............. *B23K 26/03* (2013.01); *B23K 26/40* (2013.01)

(58) Field of Classification Search
CPC ... B23K 26/03; B23K 26/40; H01L 21/67092; H01L 21/67259; H01L 21/681; H01L 21/6838
See application file for complete search history.

(56) References Cited

U.S. PATENT DOCUMENTS 9,934,957 B2 *   4/2018   Kozai ............... H01L 21/68728
2017/0243738 A1 *  8/2017   Noda .................... G03F 7/2028

FOREIGN PATENT DOCUMENTS

JP          2015159241 A     9/2015

* cited by examiner

*Primary Examiner* — Dana Ross
*Assistant Examiner* — Joe E Mills, Jr.
(74) *Attorney, Agent, or Firm* — Greer Burns & Crain, Ltd.

(57) ABSTRACT

A processing apparatus includes a chuck table for sucking and holding a workpiece and a camera unit imaging the workpiece. The chuck table includes a light passing portion that passes light. The light passing portion includes a first region that overlaps with the workpiece and has a first mirror face that reflects light that advances from the first region into the light passing portion. The camera unit can image the workpiece by detecting light reflected by the first mirror face after having been reflected by the workpiece held by the chuck table and advanced into the light passing portion.

16 Claims, 6 Drawing Sheets

PROCESSING APPARATUS FOR PROCESSING WORKPIECE

BACKGROUND OF THE INVENTION

Field of the Invention

The present invention relates to a processing apparatus that includes a chuck table for sucking and holding a workpiece such as a semiconductor wafer and processes the workpiece sucked to and held on the chuck table.

Description of the Related Art

A device chip that is used in electronic equipment such as a portable telephone set or a computer is formed by dividing a semiconductor wafer, on the front face of which a plurality of devices is arranged side by side, for each of the devices. When a semiconductor wafer is divided, a processing apparatus such as, for example, a cutting apparatus including a ring-shaped cutting blade or a laser processing apparatus including a laser processing unit irradiating a laser beam upon a workpiece is used. In such processing apparatus, a workpiece is processed along a scheduled division line set between devices formed on the front face of a workpiece. In such processing apparatus, to process a workpiece along a scheduled division line, a camera unit is provided which images the workpiece to detect a scheduled division line. When a workpiece is to be processed by a processing apparatus, the workpiece is placed with the front face directed upwardly on a chuck table for sucking and holding a workpiece, and the workpiece is sucked to and held on the chuck table. Then, the front face of the workpiece is imaged by the camera unit to detect a pattern configuring devices or a key pattern formed between devices, and the position of a scheduled division line is specified on the basis of the positions of such patterns.

However, depending upon the type of the workpiece or the substance of the process, it is sometimes necessary to carry out processing in a state in which the front face of the workpiece is directed downwardly. In this case, if a camera unit that can detect light of a wavelength that passes through the workpiece is used, then the front face side of the workpiece that is not exposed can be imaged through the workpiece. For example, in the case where the workpiece is a silicon wafer, an infrared camera can be used for the camera unit. However, a metal film or a resin film that does not pass light of a wavelength that passes through a workpiece is sometimes arranged on the rear face side of the workpiece. In this case, even if a camera unit that can detect light of a wavelength that passes through the workpiece is used, the front face side of the workpiece cannot be imaged through the metal film or the resin film. Therefore, a method has been proposed by which a metal film or a resin film is removed from an outer peripheral edge of a workpiece such that the front face side of the workpiece is imaged through the workpiece at the position at which the rear face of the workpiece is exposed to detect a scheduled division line (refer to Japanese Patent Laid-Open No. 2015-159241).

SUMMARY OF THE INVENTION

In order to observe the front face side of a workpiece, which has a metal film or the like arranged on the rear face side thereof, through the workpiece using a camera unit, the metal film, or the like must be removed with a sufficient width from an outer peripheral edge of the workpiece. Therefore, an edge trimming apparatus for exclusive use is required which includes a cutting blade having a great width (thickness) and processes a workpiece along an outer peripheral edge of the same while a chuck table that holds the workpiece thereon is rotated. However, the load of the processing carried out by the edge trimming apparatus is heavy and the cost of a thick cutting blade is also high. In this regard, the method described has a subject to be solved.

Therefore, it is an object of the present invention to provide a processing apparatus that can easily image a face, which opposes to a chuck table, of a workpiece held on the chuck table.

In accordance with an aspect of the present invention, there is provided a processing apparatus including a chuck table having a holding face exposed upwardly and configured to suck and hold a plate-like workpiece placed on the holding face, a camera unit arranged above the chuck table and configured to image the workpiece held by the chuck table, and a processing unit configured to process the workpiece on the basis of an imaging result of the camera unit, in which the chuck table includes a holding portion that has an upper face configuring part of the holding face and causes a negative pressure to act upon the workpiece placed on the holding face, and a light passing portion that passes light, the light passing portion includes a first region that overlaps with the workpiece held by the chuck table and configures another part of the holding face, the light passing portion has a first mirror face that reflects light that advances from the first region into the light passing portion, and the camera unit is capable of imaging, by detecting light reflected by the first mirror face after having been reflected by a second region opposing to the first region of the workpiece held by the chuck table and advanced from the first region into the light passing portion, the second region of the workpiece.

Preferably, the processing apparatus further includes an external mirror provided on an outer side in a diametrical direction of the chuck table, in which the light passing portion has an exposed face exposed to a side face of the chuck table, the camera unit is positioned above the external mirror when the light is to be detected, and the external mirror reflects the light having advanced from the exposed face of the light passing portion to the camera unit. Alternatively, preferably the light passing portion further includes a third region that does not overlap with the workpiece held by the chuck table and configures a further other part of the holding face, the camera unit is positioned above the third region when the light is to be detected, and the light passing portion further has a second mirror face that reflects the light reflected by the first mirror toward the camera unit through the third region.

Preferably, the light passing portion includes a light passing member that shields an internal space of the light passing portion from outside. Alternatively, preferably, the light passing portion is filled with a light passing member.

In the processing apparatus according to the one aspect of the present invention, the chuck table for sucking and holding a workpiece includes the light passing portion for passing light in addition to the holding portion for causing a negative pressure to act upon the workpiece. Further, the holding face that is an upper face of the chuck table includes the first region of the light passing portion. The light passing portion includes the first mirror face that reflects light advancing from the first region into the light passing portion. The camera unit can detect the light reflected by the second region of the workpiece opposing to the first region of the light passing portion through the light passing portion. Therefore, the second region of the workpiece can be imaged by the camera unit.

Accordingly, with the one aspect of the present invention, a processing apparatus that can easily image a face of a workpiece held by the chuck table opposing to the chuck table is provided.

The above and other objects, features and advantages of the present invention and the manner of realizing them will become more apparent, and the invention itself will best be understood, from a study of the following description and appended frames with reference to the attached drawings showing a preferred embodiment of the invention.

DETAILED DESCRIPTION OF THE PREFERRED EMBODIMENT

An embodiment according to one aspect of the present invention is described with reference to the accompanying drawings. In the processing apparatus according to the present embodiment, a plate-like workpiece is processed along a scheduled division line set on the workpiece. First, a workpiece that is processed by the processing apparatus according to the present embodiment is described. The workpiece that is processed by the processing apparatus according to the present embodiment is a substantially disk-shaped wafer formed of, for example, Si (silicon), SiC (silicon carbide), GaN (gallium nitride), GaAs (gallium arsenide) or some other semiconductor material. Alternatively, the workpiece is a plate-like substrate or the like made of a material such as sapphire, quartz, glass, or ceramics. The glass is, for example, alkali glass, alkali free glass, soda lime glass, lead glass, borosilicate glass, quartz glass, or the like.

Figure 1A:
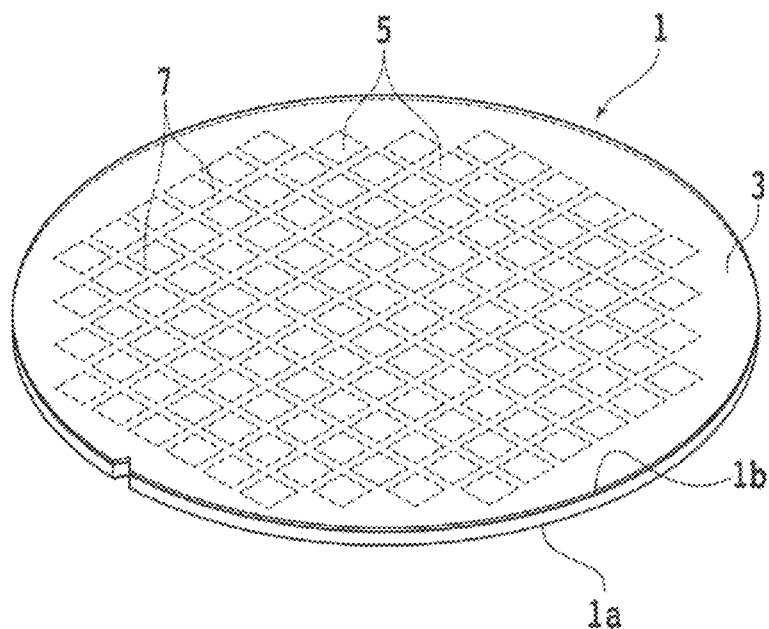
FIG. 1A is a perspective view schematically depicting a rear face side of a wafer.
Figure 1B:
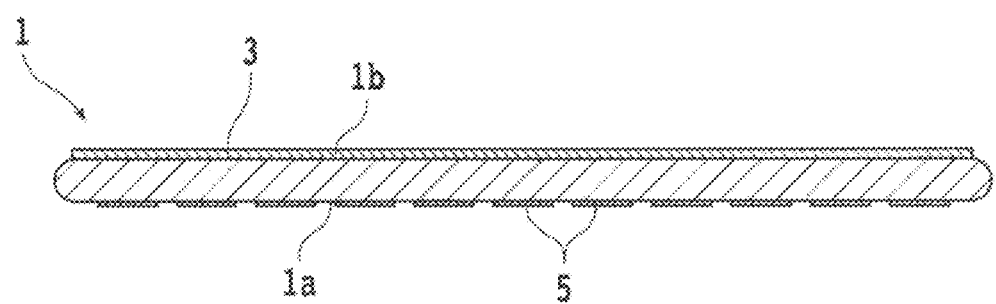
FIG. 1B is a sectional view schematically depicting the wafer.

FIG. 1A schematically depicts a perspective view of the rear face 1b side of a substantially disk-like wafer 1 formed from a semiconductor material as an example of a workpiece. Meanwhile, FIG. 1B schematically depicts a sectional view of the wafer 1. On a front face 1a of the wafer 1, a plurality of devices 5 such as integrated circuits (ICs), or large scale integrations (LSIs) is formed. To the wafer 1, a scheduled division line 7 is set between the devices 5. If the wafer 1 is divided along such scheduled division lines 7, then individual device chips can be formed.

In the processing apparatus, in order to process a workpiece such as the wafer 1 along a scheduled division line 7, a camera unit detecting the scheduled division line 7 is arranged in the proximity of a processing unit processing a workpiece. When a scheduled division line 7 is to be detected, the upper face of the wafer 1 is imaged by the camera unit first, and a specific pattern of elements, electrodes, wiring lines, and so forth included in the device 5 and a pattern of a test element group (TEG) or the like formed in an overlapping relation with the scheduled division line 7 are detected. Since the positional relation of the patterns and the scheduled division lines 7 on the front face 1a of the wafer 1 (workpiece) is determined in advance, the position of a scheduled division line 7 can be specified on the basis of the positions of the patterns. Thereafter, the processing unit processes the wafer 1 along the specified scheduled division line 7. In other words, the processing unit processes the wafer 1 on the basis of an imaging result of the camera unit.

Figure 2A:
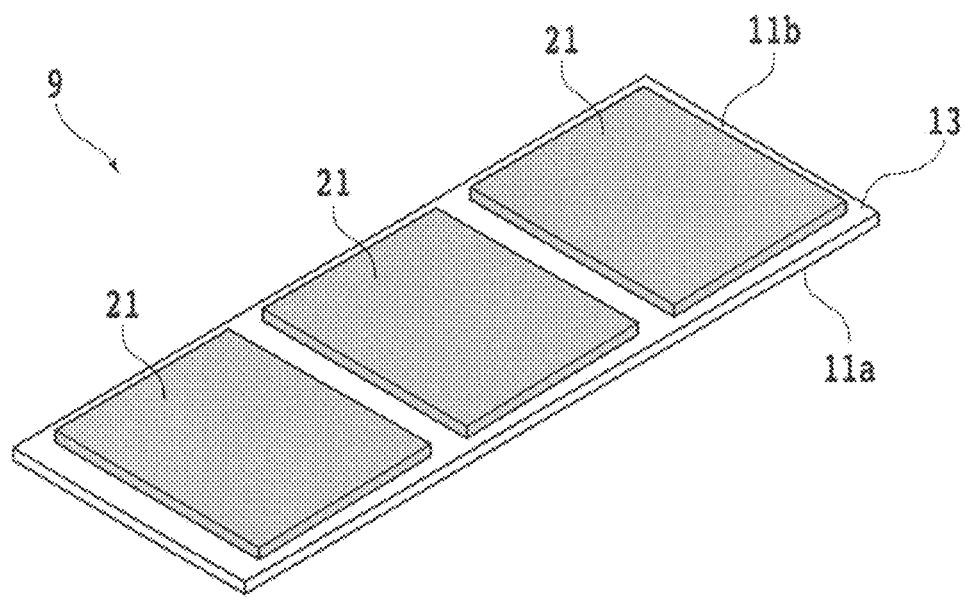
FIG. 2A is a perspective view schematically depicting a front face side of a resin package substrate.
Figure 2B:
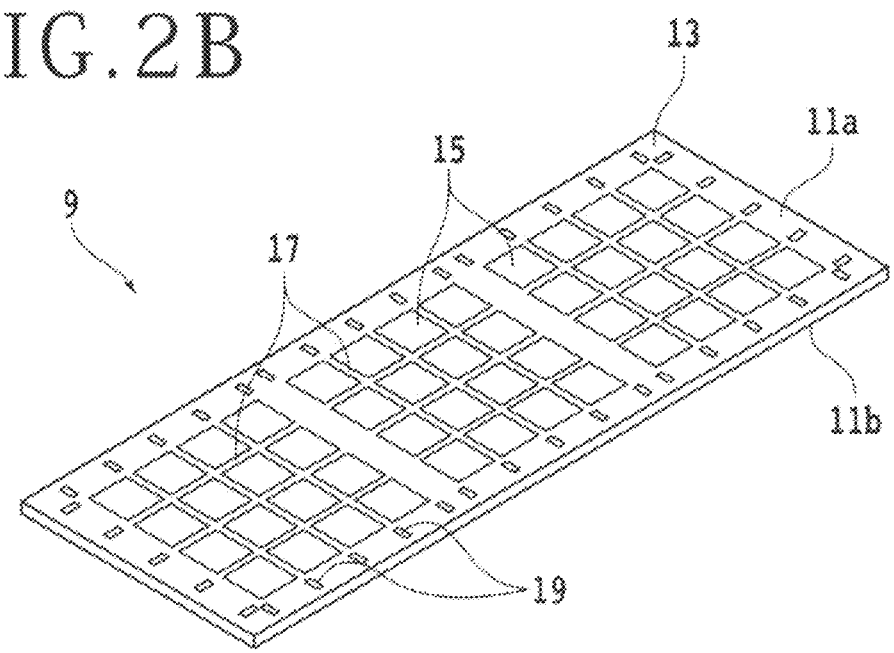
FIG. 2B is a perspective view schematically depicting a rear face side of the resin package substrate.

Further, the workpiece to be processed by the processing apparatus according to the present embodiment is not limited to this. For example, FIGS. 2A and 2B schematically depict a resin package substrate 9 formed such that a plurality of devices 15 is sealed by sealing resin (molding resin) 21. FIG. 2A is a perspective view schematically depicting the rear face 11b side of the resin package substrate 9, and FIG. 2B is a perspective view schematically depicting the front face 11a side of the resin package substrate 9. The resin package substrate 9 has a rectangular metal frame member 13 that holds the plurality of devices 15. The plurality of the devices 15 is arranged in perpendicular directions on the inner side of the metal frame member 13, and the plurality of devices 15 is sealed collectively by the sealing resin 21. Further, on outer peripheral portions on the front face 11a side of the resin package substrate 9, markers 19 indicative of the position of scheduled division lines 17 are formed individually at end portions of each of the scheduled division lines 17. If the camera unit of the processing apparatus detects a marker 19, then it can specify the position of a scheduled division line 17. Then, if the resin package substrate 9 is processed and divided along such scheduled division lines 17 by the processing apparatus, then the individual device chips sealed by the sealing resin 21 are obtained.

It is to be noted that the wafer 1 is sometimes processed in a state in which the front face 1a of the wafer 1 (workpiece) is directed downwardly and the rear face 1b side is exposed upwardly as depicted in FIGS. 1A and 1B. In this case, since the front face 1a side of the wafer 1 cannot be imaged by the camera unit, the scheduled division lines 7 cannot be detected. Therefore, it is conceivable to use an imaging device capable of detecting light of a wavelength that can pass through the wafer 1 as the camera unit and image the front face 1a of the wafer 1 through the wafer 1. However, a metal film 3 is sometimes formed for various objects on the rear face 1b side of the wafer 1 as depicted in FIGS. 1A and 1B. Alternatively, a resin film is sometimes formed in place of the metal film 3. Then, light of the wavelength that can pass through the wafer 1 cannot sometimes pass through such films. In those cases, the front face 1a side of the wafer 1 cannot still be imaged by the camera unit. Further, the resin package substrate 9 (workpiece) is sometimes processed with the rear face 11b side directed upwardly as depicted in FIG. 2A. Also, in this case, the markers 19 and so forth formed on the front face 11a side cannot be observed through the sealing resin 21 and the metal frame member 13.

Figure 3:
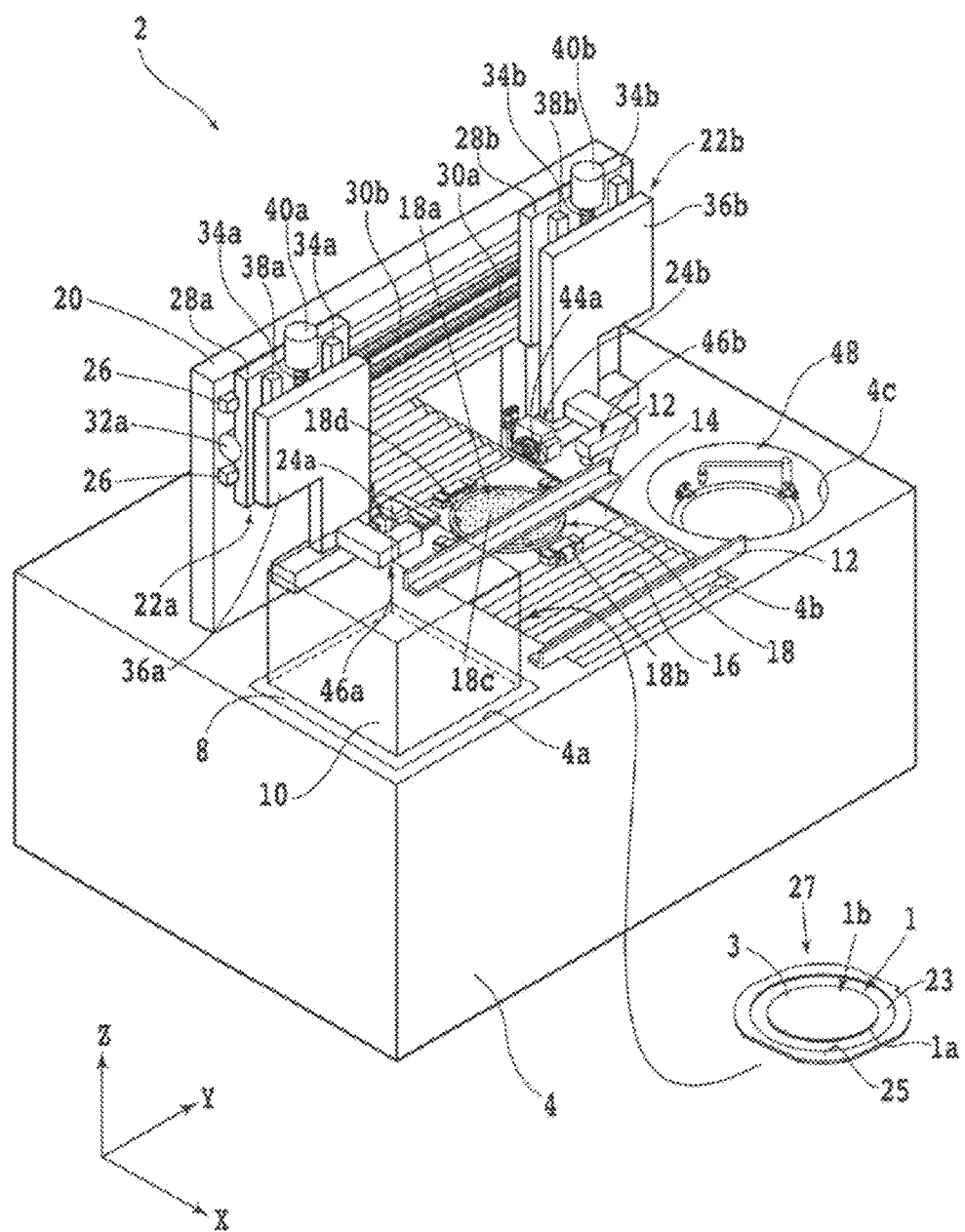
FIG. 3 is a perspective view schematically depicting a processing apparatus.

Therefore, in the processing apparatus according to the present embodiment, a light passing portion is provided on a chuck table for holding a workpiece such that a lower face of the workpiece is observed through the light passing portion by a camera unit. In the following, the processing apparatus according to the present embodiment is described. FIG. 3 is a perspective view schematically depicting a cutting apparatus 2 that is an example of the processing apparatus according to the present embodiment. However, it is to be noted that the processing apparatus is not restricted to the cutting apparatus 2. Further, FIG. 3 schematically depicts a wafer 1 as an example of a workpiece. However, the workpiece is not limited to the wafer 1.

Before a wafer 1 is carried into the cutting apparatus 2, an adhesive tape 23 that is attached so as to close up an opening of an ring-shaped frame 25 formed of a metal or the like in advance is attached to the wafer 1. Then, the wafer 1 that is in a state of a frame unit 27 in which the wafer 1, adhesive tape 23, and ring-shaped frame 25 are integrated is carried into and cut by the cutting apparatus 2. Then, individual device chips formed by division of the wafer 1 are supported by the adhesive tape 23 and thereafter picked up from the adhesive tape 23. The cutting apparatus 2 includes a base 4 for supporting components thereof. An opening 4a is formed at a front corner portion of the base 4, and a cassette support stand 8 is provided in the opening 4a such that it is moved upwardly and downwardly by a lifting mechanism (not depicted). A cassette 10 that accommodates a plurality of wafers 1 therein is mounted on an upper face of the cassette support stand 8. It is to be noted that, in FIG. 3, only a contour of the cassette 10 is depicted for the convenience of illustration.

A rectangular opening 4b is formed alongside the cassette support stand 8 such that it has a longitudinal direction along an X-axis direction (forward and backward direction, processing feeding direction). In the opening 4b, an X-axis moving mechanism of the ball screw type (not depicted) and a table cover 14 and a dustproof and splashproof cover 16 that cover the X-axis moving mechanism from above are arranged. The X-axis moving mechanism includes an X-axis moving table (not depicted) covered with the table cover 14 and moves the X-axis moving table in the X-axis direction.

On an upper face of the X-axis moving table, a table base 18f (refer to FIG. 5A and so forth) is provided so as to be exposed from the table cover 14, and a chuck table 18 is arranged at an upper end of the table base 18f. The chuck table 18 has a function for sucking and holding a workpiece placed on an upwardly exposed holding face 18a. The chuck table 18 is connected to a rotational driving source (not depicted) such as a motor and rotates around an axis of rotation substantially parallel to the Z-axis direction (vertical direction). Further, the chuck table 18 is moved in the X-axis direction together with the X-axis moving table and the table cover 14 by the X-axis moving mechanism.

Figure 5A:
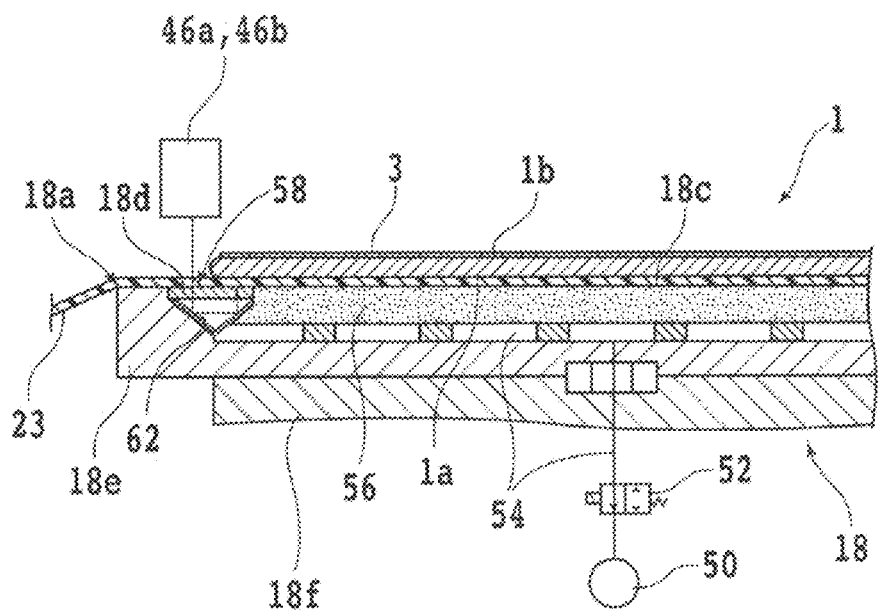
FIG. 5A is a sectional view schematically depicting a manner in which the front face side of a workpiece is imaged by a camera unit.

FIG. 5A schematically depicts a sectional view of an example of the chuck table 18. The chuck table 18 includes a porous holding portion 56 of a diameter similar to that of the wafer 1, and a frame body 18e that covers the outer periphery side and the bottom face side of the holding portion 56. In the inside of the chuck table 18, a suction path 54 is formed which is connected at one end to a suction source 50 such as an ejector provided outside the chuck table 18. The other end of the suction path 54 extends to the holding portion 56. A switching portion 52 is provided on the suction path 54 such that, if the switching portion 52 is operated, then the suction source 50 and the holding portion 56 can be switched between a connection state and a disconnection state. Then, when the wafer 1 is to be held by the chuck table 18, the frame unit 27 is placed on the holding face 18a of the chuck table 18 first. Then, the switching portion 52 is operated to connect the suction source 50 and the holding portion 56 to each other through the suction path 54 such that a negative pressure generated by the suction source 50 acts upon the wafer 1 through the adhesive tape 23.

An upper face 18c of the holding portion 56 is exposed to the holding face 18a of the chuck table 18. The upper face 18c of the holding portion 56 has a diameter equivalent to that of the wafer 1 of a workpiece and is formed substantially in parallel to the X-axis direction and the Y-axis direction. Further, four clamps 18b for fixing the ring-shaped frame 25 for supporting the wafer 1 from all sides are provided around the chuck table 18.

The cutting apparatus 2 includes, in a region adjacent the opening 4b, a transport unit (not depicted) for transporting a wafer 1 to the chuck table 18 and so forth. At a position sidewardly adjacent the cassette support stand 8, a temporary placement mechanism for temporarily placing the wafer 1 is provided. The temporary placement mechanism includes a pair of guide rails 12 movable toward and away from each other while keeping a state in which they extend in parallel, for example, to the Y-axis direction (indexing feeding direction). The pair of guide rails 12 sandwich a wafer 1 extracted from the cassette 10 by the transport unit in the X axis direction and adjust the wafer 1 to a predetermined position. The wafer 1 adjusted to the predetermined position is picked up by the transport unit and transported to the chuck table 18. At this time, the pair of guide rails 12 are moved away from each other such that the wafer 1 passes between the pair of guide rails 12.

Above the chuck table 18, a first processing unit 24a and a second processing unit 24b for cutting a wafer 1 using a ring-shaped cutting blade are provided. The first processing unit 24a includes a ring-shape cutting blade 44a as depicted in FIG. 3. Further, on an upper face of the base 4, a gate-shaped support mechanism 20 for supporting the first processing unit 24a and the second processing unit 24b is arranged to extend across the opening 4b. At an upper portion of a front face of the support mechanism 20, a first moving unit 22a for moving the first processing unit 24a in the Y-axis direction and the Z-axis direction and a second moving unit 22b for moving the second processing unit 24b in the Y-axis direction and the Z axis direction are provided.

The first moving unit 22a includes a Y-axis moving plate 28a and the second moving unit 22b includes a Y-axis moving plate 28b. The Y-axis moving plate 28a and the Y-axis moving plate 28b are mounted for sliding movement on a pair of Y-axis guide rails 26 disposed along the Y-axis direction on the front face of the support mechanism 20. A nut portion (not depicted) is provided on the rear face side (back face side) of the Y-axis moving plate 28a, and a Y-axis ball screw 30a substantially parallel to the Y-axis guide rails 26 is screwed in the nut portion. Another nut portion (not depicted) is provided on the rear face side (back face side) of the Y-axis moving plate 28b, and a Y-axis ball screw 30b substantially parallel to the Y-axis guide rails 26 is screwed in the nut portion. A Y-axis stepping motor 32a is connected to one end portion of the Y-axis ball screw 30a. When the Y-axis ball screw 30a is rotated by the Y-axis stepping motor 32a, the Y-axis moving plate 28a is moved in the Y-axis direction along the Y-axis guide rails 26. Meanwhile, another Y-axis stepping motor (not depicted) is connected to one end portion of the Y-axis ball screw 30b. When the Y-axis ball screw 30b is rotated by the Y-axis stepping motor, the Y-axis moving plate 28b is moved in the Y-axis direction along the Y-axis guide rails 26.

A pair of Z-axis guide rails 34a are provided along the Z-axis direction on the surface (front face) side of the Y-axis moving plate 28a, and a pair of Z-axis guide rails 34b are provided along the Z-axis direction on the surface (front face) side of the Y-axis moving plate 28b. Further, a Z-axis moving plate 36a is attached for sliding movement on the pair of Z-axis guide rails 34a, and another Z-axis moving plate 36b is attached for sliding movement on the pair of Z-axis guide rails 34b. A nut portion (not depicted) is provided on the rear face side (back face side) of the Z-axis moving plate 36a, and a Z-axis ball screw 38a provided so as to extend in a direction substantially parallel to the Z-axis guide rails 34a is screwed in the nut portion. A Z-axis stepping motor 40a is connected to one end portion of the Z-axis ball screw 38a such that, by rotation of the Z-axis ball screw 38a by the Z-axis stepping motor 40a, the Z-axis moving plate 36a is moved in the Z-axis direction along the Z-axis guide rails 34a.

A nut portion (not depicted) is provided on the rear face side (back face side) of the Z-axis moving plate 36b, and a Z-axis ball screw 38b provided so as to extend in a direction substantially parallel to the Z-axis guide rails 34b is screwed in the nut portion. A Z-axis stepping motor 40b is connected to one end portion of the Z-axis ball screw 38b such that, when the Z-axis ball screw 38b is rotated by the Z-axis stepping motor 40b, the Z-axis moving plate 36b is moved in the Z-axis direction along the Z-axis guide rails 34b.

The first processing unit 24a is provided at a lower portion of the Z-axis moving plate 36a. A camera unit 46a for imaging a wafer 1 sucked to and held on the chuck table 18 is provided at a position adjacent the first processing unit 24a. Further, the second processing unit 24b is provided at a lower portion of the Z-axis moving plate 36b. A camera unit 46b for imaging a wafer 1 sucked to and held on the chuck table 18 is provided at a position adjacent the second processing unit 24b.

The positions of the first processing unit 24a and the camera unit 46a in the Y-axis direction and the Z-axis direction is controlled by the first moving unit 22a, and the positions of the second processing unit 24b and the camera unit 46b in the Y-axis direction and the Z-axis direction is controlled by the second moving unit 22b. In other words, the position of the first processing unit 24a and the position of the second processing unit 24b are controlled independently of each other.

An opening 4c is formed at a position on the opposite side of the opening 4a with respect to the opening 4b. A washing unit 48 for washing a wafer 1 is arranged in the opening 4c such that a wafer 1 having undergone a predetermined process on the chuck table 18 is washed by the washing unit 48. The wafer 1 washed by the washing unit 48 is accommodated back into the cassette 10.

Figure 4:
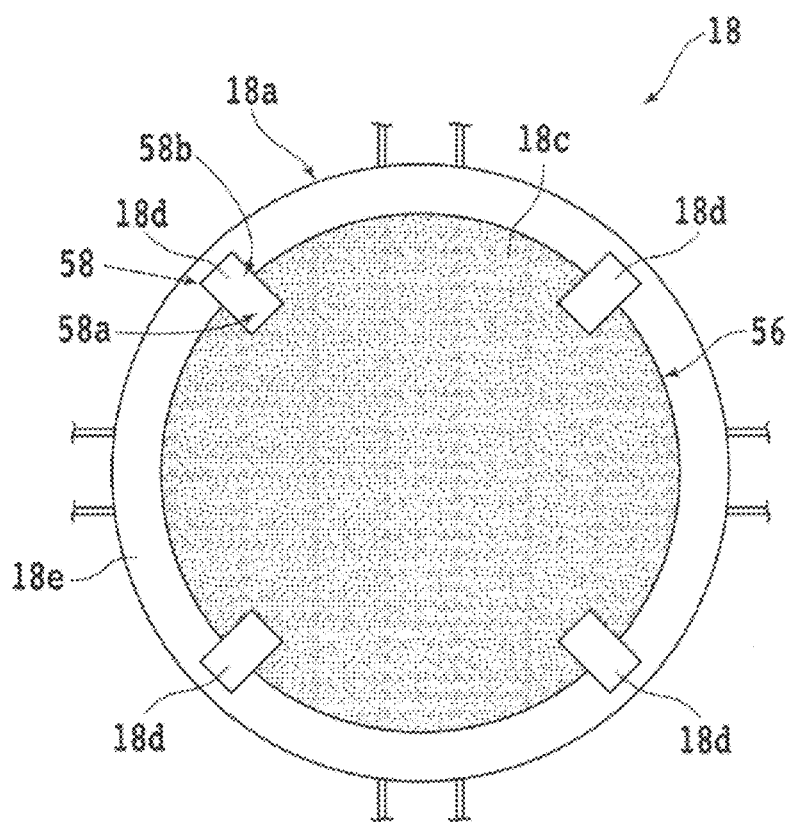
FIG. 4 is a top plan view schematically depicting an upper face of a chuck table.

In the frame unit 27 that includes a wafer 1, the wafer 1 is attached to the adhesive tape 23 from the front face 1a side. Therefore, when the wafer 1 is sucked to and held on the chuck table 18 through the adhesive tape 23, the rear face 1b side of the wafer 1 is exposed upwardly. Here, in the cutting apparatus 2 that is a processing apparatus according to the present embodiment, a light passing portion 58 is formed in the chuck table 18 (refer to FIG. 5A and so forth). Then, the front face 1a of the wafer 1 is imaged through the light passing portion 58 using the camera units 46a and 46b arranged above the chuck table 18. As depicted in FIG. 5A and so forth, the chuck table 18 includes the light passing portion 58 that passes light together with the holding portion 56 for allowing a negative pressure to act upon the wafer 1. The light passing portion 58 is a space formed in the chuck table 18. Then, as depicted in FIG. 4 and so forth, the upper face 18c of the holding portion 56 configures part of the holding face 18a of the chuck table 18. Further, another portion of the holding face 18a of the chuck table 18 is configured from a first region 58a of the light passing portion 58 that overlaps with the wafer 1 held by the first region 58a. Furthermore, a further portion of the holding face 18a is configured from a third region 58b of the light passing portion 58 that does not overlap with the wafer 1 held by the chuck table 18.

Figure 5B:
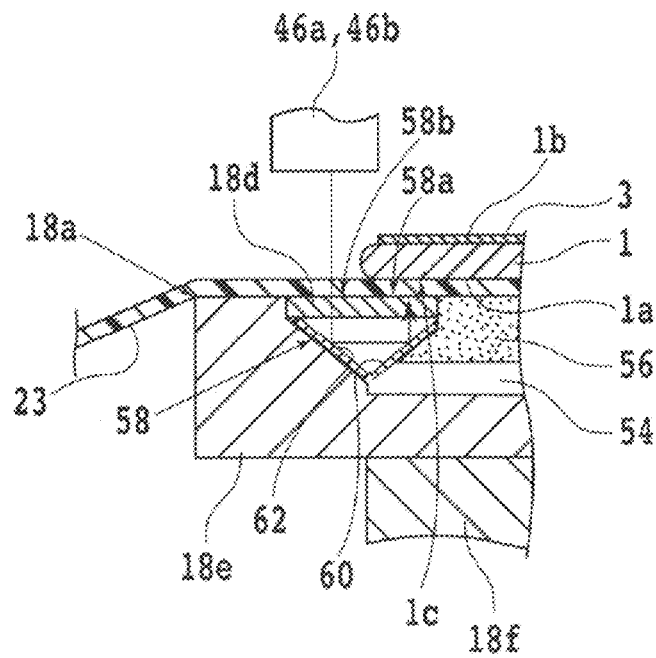
FIG. 5B is a sectional view schematically depicting a light passing portion in an enlarged scale.

FIG. 5B is a sectional view schematically depicting, in an enlarged scale, the light passing portion 58. The light passing portion 58 has a first mirror face 60 below the first region 58a and has a second mirror face 62 below the third region 58b. The first mirror face 60 reflects light advancing in the light passing portion 58 from the first region 58a. For example, the first mirror face 60 is directed such that the light is reflected toward the second mirror face 62 arranged on the outer side in a diametrical direction of the chuck table 18. Meanwhile, the second mirror face 62 is directed such that it reflects the light reflected by the first mirror face 60 toward the third region 58b. Here, the first mirror face 60 and the second mirror face 62 can be formed, for example, by providing a mirror inclined to a specific direction in the internal space of the light passing portion 58. Alternatively, they are formed by forming a wall face inclined to a specific direction in the space and performing a mirror finishing process such as to polish the wall face or to apply coating of a metal layer on the wall face.

Further, a light source not depicted may be provided on a wall face of the light passing portion 58. As an alternative, the light source may be provided outside the light passing portion 58, and for example, the light source may be provided adjacent the camera units 46a and 46b. Further, the light passing portion 58 may include a light passing member 18d that shields the inner space from the outside. For example, the light passing member 18d is provided across the first region 58a and the third region 58b of the light passing portion 58 as depicted in FIG. 4 and so forth, and the upper face of the light passing member 18d has a height same as that of the upper face 18c of the holding portion 56 as depicted in FIG. 5A and so forth. Where the light passing member 18d is provided at the light passing portion 58 so as to close up the inner space, contamination of the inside of the light passing portion 58 by processing waste or the like generated by processing of the wafer 1 is prevented. Here, it is sufficient if the light passing member 18d can pass light of a wavelength to be detected when the front face 1a side of the wafer 1 is imaged by the camera units 46a and 46b. For example, in the case where the camera units 46a and 46b detect visible light, a material such as glass, or transparent resin can be used. On the other hand, in the case where the camera units 46a and 46b are infrared cameras, a member that can pass infrared light is used for the light passing member 18d.

FIG. 5A is a sectional view schematically depicting a manner that the front face 1a side of the wafer 1 is imaged by the camera units 46a and 46b. When the front face 1a side of the wafer 1 of a workpiece is to be imaged by the camera units 46a and 46b, the camera units 46a and 46b are positioned above the third region 58b of the light passing portion 58 first. Then, the light source is rendered operative to irradiate light upon a second region 1c of the front face 1a of the wafer 1 opposing to the first region 58a. At this time, the light is reflected by the second region 1c of the wafer 1, passes through the adhesive tape 23 and the light passing member 18d, and advances from the first region 58a into the inside of the light passing portion 58. Then, the light is reflected by the first mirror face 60 and advances toward the second mirror face 62, and is then reflected by the second mirror face 62 and advances from the third region 58b to the outside of the light passing portion 58. The light passes through the light passing member 18d and the adhesive tape 23 again and comes to the camera units 46a and 46b.

In particular, the camera units 46a and 46b can detect light having been reflected by a face opposing to the holding face 18a of the workpiece (wafer 1) retained by the chuck table 18 and having proceeded in the light passing portion 58. Accordingly, in the cutting apparatus 2 that is the processing apparatus according to the present embodiment, since the light passing portion 58 is formed in the chuck table 18, a lower face of the workpiece can be imaged by the camera units 46a and 46b through the light passing portion 58.

It is to be noted that, since the wafer 1 is held by the chuck table 18, the light passing portion 58 cannot be formed over the overall area of the holding face 18a. In other words, the processing apparatus of the present embodiment cannot image the overall area of the front face 1a (lower face) of the wafer 1. However, it is possible to detect a device 5 or the like formed on the front face 1a of the wafer 1 from captured images formed by the camera units 46a and 46b and specify the position and the direction of a scheduled division line 7. Therefore, the wafer 1 can be processed along a scheduled division line 7 by the processing units 24a and 24b on the basis of the imaging result of the camera units 46a and 46b. Especially, if a plurality of light passing portions 58 is formed on the chuck table 18, then the position and the direction of a scheduled division line 7 can be detected with a higher degree of accuracy.

In the processing apparatus according to the present embodiment, when the front face 1a side of the wafer 1 is to be imaged, there is no necessity to partly remove the metal film 3 or the like formed on the rear face 1b of the wafer 1, and therefore, a processing apparatus for removing the metal film 3 and so forth is also unnecessary. Further, imaging of the front face 1a side of the wafer 1 becomes possible only by positioning the camera units 46a and 46b above the third region 58b of the light passing portion 58, and the position and the direction of a scheduled division line 7 can be detected readily in short time.

It is to be noted that, according to the cutting apparatus 2 that is the processing apparatus according to the present embodiment, light reflected by the first mirror face 60 in the inside of the light passing portion 58 need not be reflected by the second mirror face 62 provided in the inside of the light passing portion 58. In other words, the light may advance toward the outer side in a diametrical direction of the chuck table 18 such that it is reflected upwardly by an external mirror provided outside the chuck table 18. In the following, a modification example of the processing apparatus (cutting apparatus 2) according to the present embodiment is described with reference to FIGS. 6A and 6B.

Figure 6A:
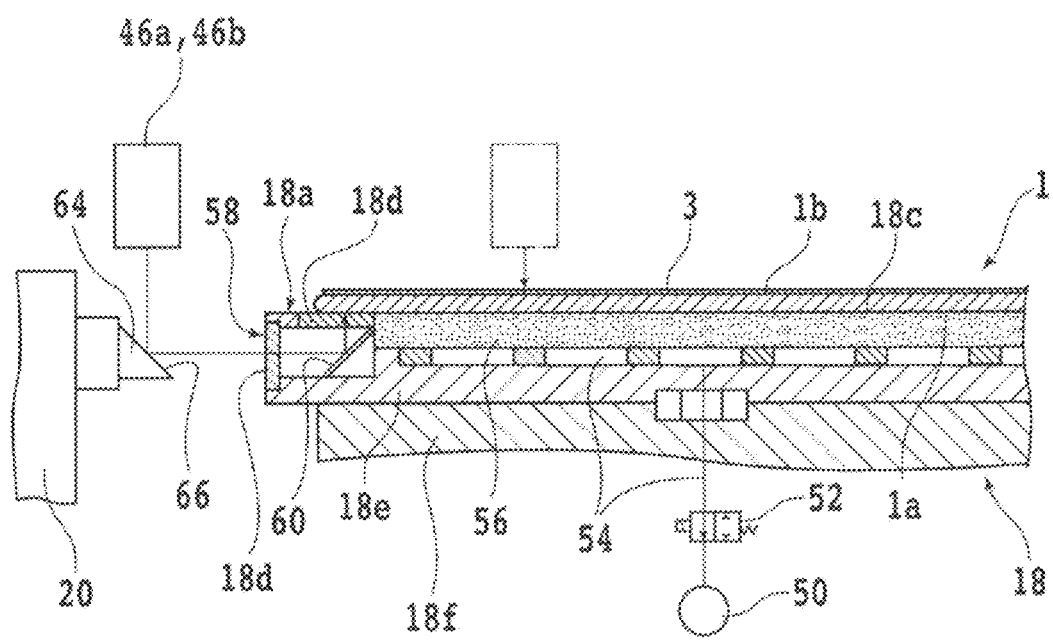
FIG. 6A is a sectional view schematically depicting a manner in which the front face side of a workpiece is imaged by a camera unit.
Figure 6B:
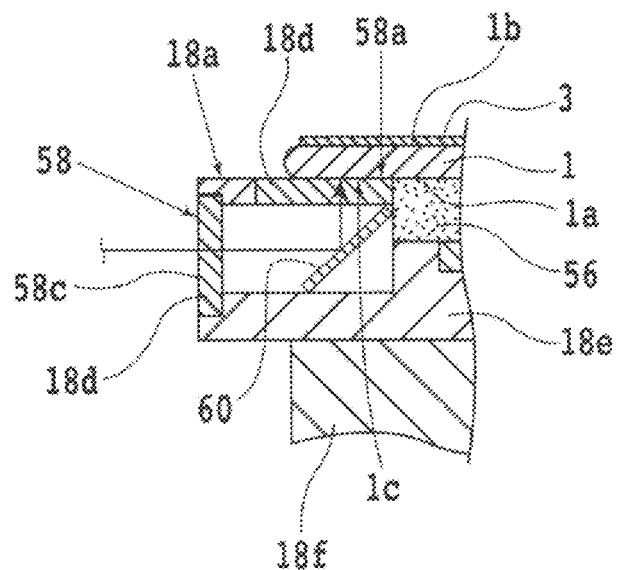
FIG. 6B is a sectional view schematically depicting a light passing portion in an enlarged scale.

FIG. 6A is a sectional view schematically depicting a manner that the front face 1a side of the wafer 1 is imaged by the camera units 46a and 46b. Meanwhile, FIG. 6B is a sectional view schematically depicting, in an enlarged scale, the light passing portion 58. It is to be noted that, in FIGS. 6A and 6B, the adhesive tape 23 attached to the front face 1a side of the wafer 1 and so forth are omitted for the convenience of illustration. The light passing portion 58 depicted in FIGS. 6A and 6B does not include the second mirror face 62. On the other hand, the cutting apparatus 2 includes an external mirror 64 provided on the outer side in a diametrical direction of the chuck table 18. The external mirror 64 is provided, for example, on a side face of the support mechanism 20 of the cutting apparatus 2. As an alternative, the external mirror 64 is provided on an inner wall face of the opening 4b of the base 4. It is to be noted that the position at which the external mirror 64 is provided is not limited to this. Further, the light passing portion 58 has an exposed face 58c exposed to the side face of the chuck table 18. As depicted in FIG. 6B and so forth, a light passing member 18d is provided on the exposed face 58c and in the first region 58a of the light passing portion 58 to suppress invasion of processing waste and so forth into the internal space of the light passing portion 58.

When the front face 1a of the wafer 1 held on the chuck table 18 is to be imaged, the camera units 46a and 46b are positioned above the external mirror 64. Then, the chuck table 18 is moved such that the exposed face 58c of the light passing portion 58 is opposed to the external mirror 64 and then is rotated. Then, the light source in the inside of or outside the light passing portion 58 is rendered operative to irradiate light on the second region 1c of the front face 1a of the wafer 1 opposing to the first region 58a of the light passing portion 58. Then, the light reflected by the second region 1c advances from the first region 58a into the light passing portion 58 and then is reflected in a direction to the outside in a diametrical direction of the chuck table 18 by the first mirror face 60 provided below the first region 58a. Thereafter, the light advances from the exposed face 58c to the outside of the light passing portion 58 and is reflected toward the camera units 46a and 46b positioned above by the mirror face 66 of the external mirror 64. The camera units 46a and 46b can image the front face 1a and the second region 1c of the wafer 1 by detecting the light. In this manner, also in the modification example of the processing apparatus according to the present embodiment, the front face 1a of the wafer 1 directed downwardly can be imaged, and the position and the direction of a scheduled division line 7 of the wafer 1 can be detected.

As described above, according to the processing apparatus according to the present embodiment, a face, which is opposed to the chuck table 18, of a workpiece held on the chuck table 18 can be imaged readily by the camera units 46a and 46b. Therefore, the processing unit of the processing apparatus can detect the position and the direction of a scheduled division line 7 on the basis of an imaging result of the camera units 46a and 46b and the workpiece can be processed along the scheduled division line 7.

It is to be noted that the present invention is not restricted to the description of the embodiment described above and can be carried out in various modified forms. For example, the embodiment described above is directed to a case in which the internal space of the light passing portion 58 is closed up with the light passing member 18d. However, the mode of the present invention is not limited to this. In other words, the light passing portion 58 may be filled with the light passing member 18d. Also, in this case, invasion of processing waste and so forth into the inside of the light passing portion 58 is prevented by the light passing member 18d. In addition, since there is no interface between the internal space of the light passing portion 58 and the light passing member 18d, occurrence of an optical phenomenon that occurs at the interface on an advancing path of light reflected by the lower face of the workpiece is suppressed.

In this case, the light becomes more likely to reach the camera units 46a and 46b more stably, and the lower face of the workpiece can be imaged more clearly.

In order to form such a light passing portion 58 as just described, for example, a hole in which the light passing portion 58 can be accommodated is formed on an upper face of the chuck table 18 and the light passing member 18d formed in a shape of the light passing portion 58 is prepared. Then, formation or the like of a metal film is performed on a lower face of the first region 58a of the light passing member 18d to form the first mirror face 60. At this time, the second mirror face 62 may be formed on a lower face of the third region 58b of the light passing portion 58. Then, the light passing portion 58 is filled into the hole formed on the upper face of the chuck table 18. Alternatively, the light passing portion 58 may be formed by forming a hole in which the light passing portion 58 can be accommodated on an upper face of the chuck table 18, forming the first mirror face 60 or the like on an inner wall of the hole, injecting resin in the form of liquid into the hole and then allowing the resin to be hardened. The light passing portion 58 filled with the light passing member 18d in this manner can be formed on the chuck table 18 by various methods. In other words, increased choices become available for the formation method of the light passing portion 58.

Furthermore, although the embodiment described hereinabove is directed to a case in which the light passing portion 58 is formed on the outer periphery side of the chuck table 18, the processing apparatus according to the present embodiment is not limited to this. In particular, the first region 58a of the light passing portion 58 may include the middle of the holding face 18a of the chuck table 18, and it is also possible to arrange the light passing portion 58 in accordance with the arrangement of an imaging location required for a workpiece held on the chuck table 18.

Further, although the embodiment described hereinabove is directed to a case in which the lower face side of a workpiece having a metal film 3 or the like formed on an upper face is imaged by the camera units 46a and 46b, the workpiece to be processed by the processing apparatus according to the present embodiment is not limited to this. In other words, the metal film 3 or the like may not be formed on the upper face of the workpiece. For example, in the case where there is a problem in imaging of the lower face side of a workpiece through the workpiece, the processing apparatus according to the present embodiment can avoid such problem.

The present invention is not limited to the details of the above described preferred embodiment. The scope of the invention is defined by the appended claims and all changes and modification examples as fall within the equivalence of the scope of the claims are therefore to be embraced by the invention.

What is claimed is:

1. A processing apparatus comprising:
a chuck table having a holding face exposed upwardly and configured to suck and hold a plate-like workpiece placed on the holding face;
a camera unit arranged above the chuck table and configured to image the workpiece held by the chuck table; and
a processing unit configured to process the workpiece on a basis of an imaging result of the camera unit,
wherein:
the chuck table includes a holding portion that has an upper face configuring part of the holding face and causes a negative pressure to act upon the workpiece placed on the holding face, and a light passing portion that passes light, wherein the light passing portion comprises an internal space formed within the chuck table,
the light passing portion includes a first region that overlaps with the workpiece held by the chuck table,
the light passing portion has a first mirror face that reflects light that advances from the first region into the light passing portion, wherein the first mirror face is located within the internal space of the light passing portion, and
the camera unit is capable of imaging, by detecting light reflected by the first mirror face after having been reflected by a second region opposing to the first region of the workpiece held by the chuck table and advanced from the first region into the light passing portion, the second region of the workpiece.

2. The processing apparatus according to claim 1, further comprising:
an external mirror provided on an outer side in a diametrical direction of the chuck table,
wherein:
the light passing portion has an exposed face exposed to a side face of the chuck table,
the camera unit is positioned above the external mirror when the light is to be detected, and
the external mirror reflects the light having advanced from the exposed face of the light passing portion to the camera unit.

3. The processing apparatus according to claim 1, wherein:
the light passing portion further includes a third region that does not overlap with the workpiece held by the chuck table,
the camera unit is positioned above the third region when the light is to be detected, and
the light passing portion further has a second mirror face that reflects the light reflected by the first mirror face toward the camera unit through the third region.

4. The processing apparatus according to claim 1, wherein the light passing portion includes a light passing member that extends across an upper portion of the light passing portion and is configured and arranged to shield the internal space of the light passing portion from outside.

5. The processing apparatus according to claim 1, wherein the internal space of the light passing portion is filled with a light passing member that is made of a material configured and arranged to pass visible light therethrough.

6. The processing apparatus according to claim 5, wherein the material of the light passing member comprises glass.

7. The processing apparatus according to claim 5, wherein the material of the light passing member comprises a transparent resin.

8. The processing apparatus according to claim 1, wherein the light passing portion is filled with a light passing member that is made of a material configured and arranged to pass infrared light therethrough.

9. A processing apparatus comprising:
a chuck table having a holding face exposed upwardly and configured to suck and hold a plate-like workpiece placed on the holding face;
a camera unit arranged above the chuck table and configured to image the workpiece held by the chuck table; and
a processing unit configured to process the workpiece on a basis of an imaging result of the camera unit,
wherein:

the chuck table includes a holding portion that has an upper face configuring part of the holding face and causes a negative pressure to act upon the workpiece placed on the holding face, and a light passing portion that passes light, wherein the light passing portion comprises an internal space formed within the chuck table, the chuck table includes a frame body that extends below the internal space of the light passing portion, the light passing portion includes a first region that overlaps with the workpiece held by the chuck table, the light passing portion has a first mirror face that reflects light that advances from the first region into the light passing portion, and the camera unit is capable of imaging, by detecting light reflected by the first mirror face after having been reflected by a second region opposing to the first region of the workpiece held by the chuck table and advanced from the first region into the light passing portion, the second region of the workpiece.

10. The processing apparatus according to claim 9, further comprising:

an external mirror provided on an outer side in a diametrical direction of the chuck table, wherein:

the light passing portion has an exposed face exposed to a side face of the chuck table, the camera unit is positioned above the external mirror when the light is to be detected, and the external mirror reflects the light having advanced from the exposed face of the light passing portion to the camera unit.

11. The processing apparatus according to claim 9, wherein:

the light passing portion further includes a third region that does not overlap with the workpiece held by the chuck table, the camera unit is positioned above the third region when the light is to be detected, and the light passing portion further has a second mirror face that reflects the light reflected by the first mirror face toward the camera unit through the third region.

12. The processing apparatus according to claim 9, wherein the light passing portion includes a light passing member that extends across an upper portion of the light passing portion and is configured and arranged to shield the internal space of the light passing portion from outside.

13. The processing apparatus according to claim 9, wherein the internal space of the light passing portion is filled with a light passing member that is made of a material configured and arranged to pass visible light therethrough.

14. The processing apparatus according to claim 13, wherein the material of the light passing member comprises glass.

15. The processing apparatus according to claim 13, wherein the material of the light passing member comprises a transparent resin.

16. The processing apparatus according to claim 9, wherein the light passing portion is filled with a light passing member that is made of a material configured and arranged to pass infrared light therethrough.

* * * * *